United States Patent
Nakatani et al.

(10) Patent No.: US 12,424,463 B2
(45) Date of Patent: Sep. 23, 2025

(54) METHOD OF PROCESSING SUBSTRATE, METHOD OF MANUFACTURING SEMICONDUCTOR DEVICE, SUBSTRATE PROCESSING SYSTEM, AND RECORDING MEDIUM

(71) Applicant: Kokusai Electric Corporation, Tokyo (JP)

(72) Inventors: Kimihiko Nakatani, Toyama (JP); Takayuki Waseda, Toyama (JP); Shoma Miyata, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 493 days.

(21) Appl. No.: 17/853,341

(22) Filed: Jun. 29, 2022

(65) Prior Publication Data

US 2023/0079925 A1 Mar. 16, 2023

(30) Foreign Application Priority Data

Sep. 14, 2021 (JP) .................................. 2021-149710

(51) Int. Cl.
*H01L 21/67* (2006.01)
*H01L 21/324* (2006.01)

(52) U.S. Cl.
CPC ...... *H01L 21/67109* (2013.01); *H01L 21/324* (2013.01); *H01L 21/3247* (2013.01)

(58) Field of Classification Search
None
See application file for complete search history.

(56) References Cited

U.S. PATENT DOCUMENTS

| | | | |
|---|---|---|---|
| 2003/0104706 A1* | 6/2003 | Mitsuhashi | H01L 21/28185 257/E21.444 |
| 2011/0217833 A1* | 9/2011 | Lee | H10D 64/685 438/591 |
| 2014/0242789 A1* | 8/2014 | Akasaka | H01L 21/28185 438/591 |
| 2014/0287595 A1 | 9/2014 | Shimamoto et al. | |
| 2016/0155634 A1 | 6/2016 | Shimamoto et al. | |
| 2016/0181109 A1 | 6/2016 | Akasaka et al. | |

(Continued)

FOREIGN PATENT DOCUMENTS

| | | |
|---|---|---|
| JP | 2013-080834 A | 5/2013 |
| JP | 2015-165523 A | 9/2015 |

(Continued)

OTHER PUBLICATIONS

Japanese Office Action issued on Jan. 31, 2023 for Japanese Patent Application No. 2021-149710.

(Continued)

*Primary Examiner* — Allan W. Olsen
(74) *Attorney, Agent, or Firm* — Volpe Koenig

(57) ABSTRACT

There is provided a technique that includes (a) forming a film on a substrate by exposing the substrate to a film-forming agent under a first temperature; (b) heat-treating the film under a second temperature higher than the first temperature; (c) altering the heat-treated film by exposing the heat-treated film to an altering agent; and (d) removing the altered film by exposing the altered film to a removing agent.

19 Claims, 6 Drawing Sheets

(56) References Cited

U.S. PATENT DOCUMENTS

| | | |
|---|---|---|
| 2016/0211135 A1 | 7/2016 | Noda et al. |
| 2020/0168453 A1 | 5/2020 | Saly et al. |
| 2022/0056593 A1 | 2/2022 | Takeda et al. |

FOREIGN PATENT DOCUMENTS

| | | |
|---|---|---|
| JP | 2016-103650 A | 6/2016 |
| KR | 10-2014-0068149 A | 6/2014 |
| WO | 2015/045163 A1 | 4/2015 |
| WO | 2020/179449 A1 | 9/2020 |

OTHER PUBLICATIONS

Korean Office Action issued on Jan. 12, 2024 for Korean Patent Application No. 10-2022-0080326.

* cited by examiner

METHOD OF PROCESSING SUBSTRATE, METHOD OF MANUFACTURING SEMICONDUCTOR DEVICE, SUBSTRATE PROCESSING SYSTEM, AND RECORDING MEDIUM

CROSS-REFERENCE TO RELATED APPLICATION

This application is based upon and claims the benefit of priority from Japanese Patent Application No. 2021-149710, filed on Sep. 14, 2021, the entire contents of which are incorporated herein by reference.

TECHNICAL FIELD

The present disclosure relates to a method of processing a substrate, a method of manufacturing a semiconductor device, a substrate processing system, and a recording medium.

BACKGROUND

As a process of manufacturing a semiconductor device, a process of forming a film on a surface of a substrate and a process of heat-treating the film may be performed.

Although processing resistance of a film can be increased by heat treatment, it may be difficult to remove the film after a predetermined processing is completed.

SUMMARY

Some embodiments of the present disclosure provide a technique capable of selectively removing a film after heat treatment.

According to one or more embodiments of the present disclosure, there is provided a technique that includes (a) forming a film on a substrate by exposing the substrate to a film-forming agent under a first temperature; (b) heat-treating the film under a second temperature higher than the first temperature; (c) altering the heat-treated film by exposing the heat-treated film to an altering agent; and (d) removing the altered film by exposing the altered film to a removing agent.

BRIEF DESCRIPTION OF DRAWINGS

The accompanying drawings, which are incorporated in and constitute a part of the specification, illustrate embodiments of the present disclosure.

FIG. 4A is a schematic cross-sectional view showing a surface portion of a wafer in which a silicon oxide film (SiO film) as a first base and a silicon nitride film (SiN film) as a second base are exposed on the surface of the wafer.

FIG. 4B is a schematic cross-sectional view showing the surface portion of the wafer after at least a portion of the molecular structure of molecules constituting a modifying agent is adsorbed on the surface of the SiO film by performing step F from the state of FIG. 4A to form a film-forming inhibition layer.

FIG. 4C is a schematic cross-sectional view showing the surface portion of the wafer after a film is selectively formed on the surface of the SiN film by performing step A from the state of FIG. 4B.

FIG. 4D is a schematic cross-sectional view showing the surface portion of the wafer after the film formed on the surface of the SiN film is heat-treated by performing step B from the state of FIG. 4C.

FIG. 4E is a schematic cross-sectional diagram showing the surface portion of the wafer after the film formed on the surface of the SiN film is altered by performing a predetermined process from the state of FIG. 4D and then performing step C.

FIG. 4F is a schematic cross-sectional diagram showing the surface portion of the wafer after the film formed on the surface of the SiN film is removed by performing step D from the state of FIG. 4E to expose the surface of the SiN film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

One or more embodiments of the present disclosure will now be described mainly with reference to FIGS. 1 to 3 and 4A to 4F. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
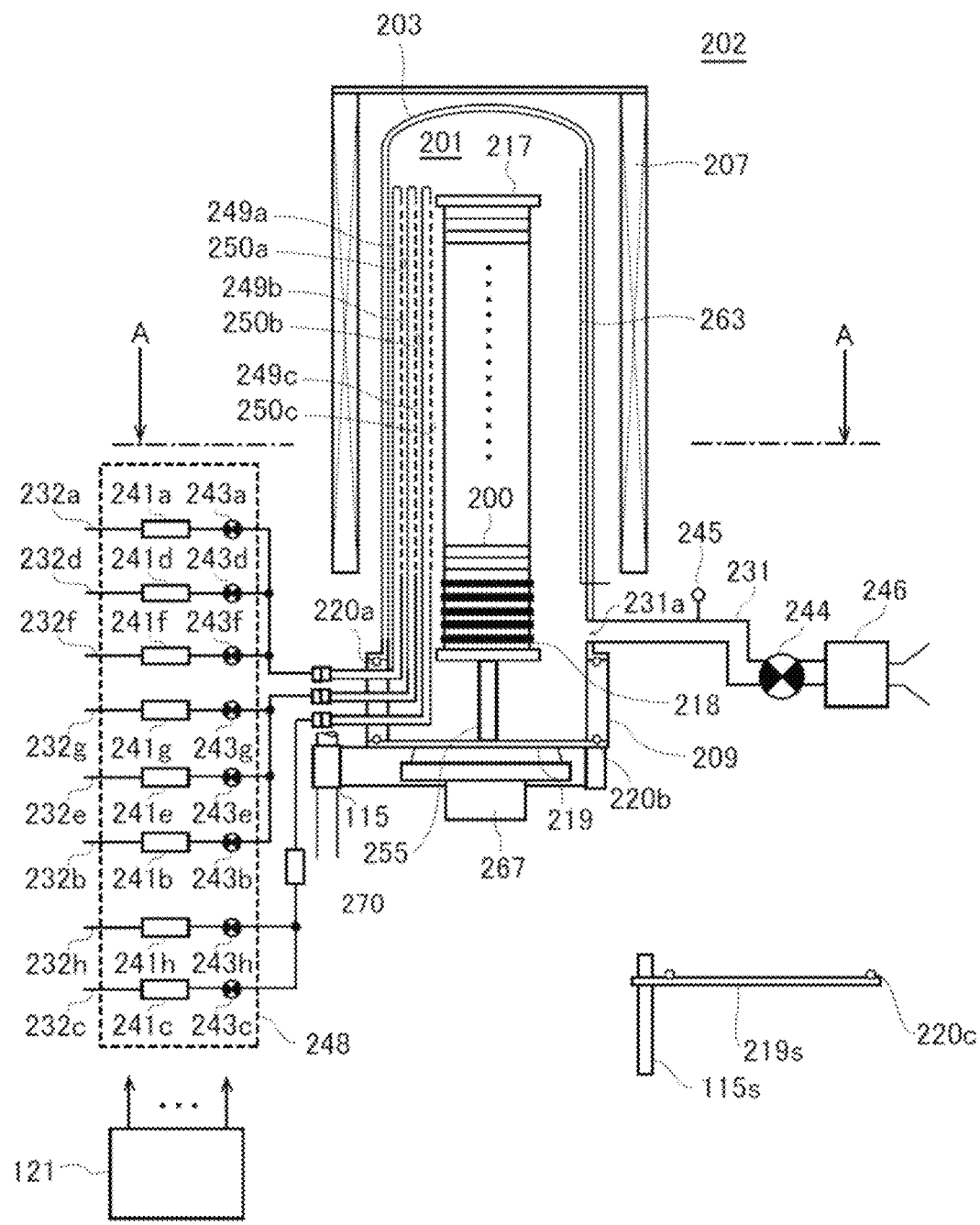
FIG. 1 is a schematic configuration view of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a temperature adjustor (a heating part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is composed of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is composed of, for example, a metal material such as stainless steel (SUS), and has a cylindrical shape with both of its upper and lower ends opened. The upper end portion of the manifold 209 engages with the lower end portion of the reaction tube 203 to support the reaction tube 203. An O-ring 220a serving as a seal member is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Process to the wafers 200 is performed in the process chamber 201.

Nozzles 249a to 249c as first to third supply parts are provided in the process chamber 201 to penetrate through a sidewall of the manifold 209. The nozzles 249a to 249c are also referred to as first to third nozzles, respectively. The nozzles 249a to 249c are composed of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is provided adjacent to the nozzle 249b.

Mass flow controllers (MFCs) 241a to 241c, which are flow rate controllers (flow rate control parts), and valves 243a to 243c, which are opening/closing valves, are provided in the gas supply pipes 232a to 232c, respectively, sequentially from the upstream side of a gas flow. Each of gas supply pipes 232d and 232f is connected to the gas supply pipe 232a at the downstream side of the valves 243a. Each of gas supply pipes 232e and 232g is connected to the gas supply pipe 232b at the downstream side of the valves 243b. A gas supply pipe 232h is connected to the gas supply pipe 232c at the downstream side of the valves 243c. MFCs 241d to 241h and valves 243d to 243h are provided in the gas supply pipes 232d to 232h, respectively, sequentially from the upstream side of a gas flow. The gas supply pipes 232a to 232h are composed of, for example, a metal material such as SUS.

Figure 2:
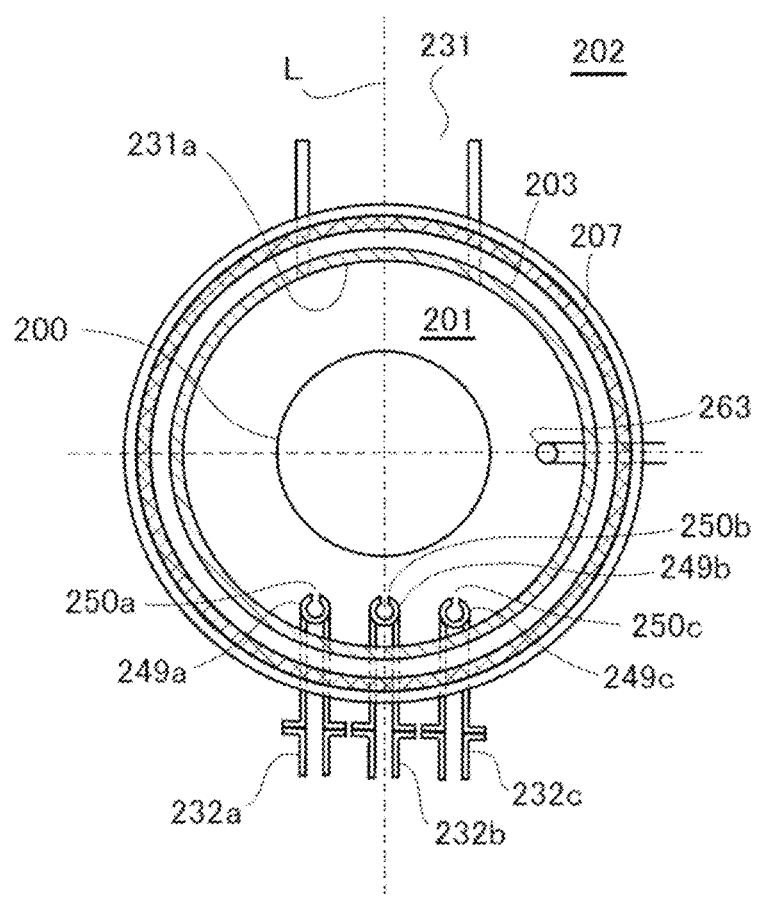
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249a to 249c is provided in an annular space (in a plane view) between an inner wall of the reaction tube 203 and the wafers 200 to extend upward from a lower portion of the inner wall of the reaction tube 203 to an upper portion thereof, that is, along an arrangement direction of the wafers 200. Specifically, each of the nozzles 249a to 249c is provided in a region horizontally surrounding a wafer arrangement region in which the wafers 200 are arranged, at a lateral side of the wafer arrangement region, along the wafer arrangement region. In a plane view, the nozzle 249b is disposed to face an exhaust port 231a to be described later in a straight line with the centers of the wafers 200 loaded into the process chamber 201, which are interposed therebetween. The nozzles 249a and 249c are arranged to sandwich a straight line L passing through the nozzle 249b and the center of the exhaust port 231a from both sides along the inner wall of the reaction tube 203 (the outer peripheral portion of the wafers 200). The straight line L is also a straight line passing through the nozzle 249b and the centers of the wafers 200. That is, it can be said that the nozzle 249c is provided on the side opposite to the nozzle 249a with the straight line L interposed therebetween. The nozzles 249a and 249c are arranged in line symmetry with the straight line L as the axis of symmetry. Gas supply holes 250a to 250c that supply a gas are formed on the side surfaces of the nozzles 249a to 249c, respectively. Each of the gas supply holes 250a to 250c is opened to oppose (face) the exhaust port 231a in a plane view, which enables a gas to be supplied toward the wafers 200. A plurality of gas supply holes 250a to 250c are formed from the lower portion of the reaction tube 203 to the upper portion thereof.

A modifying agent is supplied from the gas supply pipe 232a into the process chamber 201 via the MFC 241a, the valve 243a, and the nozzle 249a.

A precursor is supplied from the gas supply pipe 232b into the process chamber 201 via the MFC 241b, the valve 243b, and the nozzle 249b. The precursor is used as one of film-forming agents.

An oxidizing agent is supplied from the gas supply pipe 232c into the process chamber 201 via the MFC 241c, the valve 243c, and the nozzle 249c. The oxidizing agent is used as one of the film-forming agents. The oxidizing agent is also used as one of altering agents A catalyst is supplied from the gas supply pipe 232d into the process chamber 201 via the MFC 241d, the valve 243d, the gas supply pipe 232a, and the nozzle 249a. The catalyst is used as one of the film-forming agents.

A removing agent is supplied from the gas supply pipe 232e into the process chamber 201 via the MFC 241e, the valve 243e, the gas supply pipe 232b, and the nozzle 249b. The removing agent is also used as an etching agent.

An inert gas is supplied from the gas supply pipes 232f to 232h into the process chamber 201 via the MFCs 241f to 241h, the valves 243f to 243h, the gas supply pipes 232a to 232c, and the nozzles 249a to 249c, respectively. The inert gas acts as a purge gas, a carrier gas, a dilution gas, or the like.

A remote plasma unit (RPU) 270, which is a plasma excitation part (plasma generation part or plasma generator) that excites a gas into a plasma state, is provided on the downstream side of a connection portion of the gas supply pipe 232c with the gas supply pipe 232h. Exciting a gas into a plasma state is also simply referred to as plasma excitation. By applying high frequency (RF) power, the RPU 270 makes it possible to plasmarize and excite the gas inside the RPU 270, that is, to excite the gas into a plasma state. As a plasma generation method, a capacitively-coupled plasma (CCP) method may be used, or an inductively-coupled plasma (ICP) method may be used.

The RPU 270 is configured so that the altering agent supplied from the gas supply pipe 232c can be excited into a plasma state and supplied into the process chamber 201, as the plasma-excited altering agent. Further, the RPU 270 makes it possible to excite the oxidizing agent supplied from the gas supply pipe 232c and the inert gas supplied from the gas supply pipe 232h into a plasma state and supply them into the process chamber 201.

A modifying agent supply system mainly includes the gas supply pipe 232a, the MFC 241a, and the valve 243a. A precursor supply system mainly includes the gas supply pipe 232b, the MFC 241b, and the valve 243b. An oxidizing agent supply system mainly includes the gas supply pipe 232c, the MFC 241c, and the valve 243c. The oxidizing agent supply system is also referred to as an altering agent supply system. The oxidizing agent supply system and the altering agent supply system may mainly include the gas supply pipe 232c, the MFC 241c, the valve 243c, and the RPU 270. A catalyst supply system mainly includes the gas supply pipe 232d, the MFC 241d, and the valve 243d. A removing agent supply system mainly includes the gas supply pipe 232e, the MFC 241e, and the valve 243e. The removing agent supply system is also referred to as an etching agent supply system. An inert gas supply system mainly includes the gas supply pipes 232f to 232h, the MFCs 241f to 241h, and the valves 243f to 243h. Each or all of the precursor supply system, the oxidizing agent supply system, and the catalyst supply system are also referred to as a film-forming agent supply system.

One or all of the above-described various supply systems may be configured as an integrated-type supply system 248 in which the valves 243a to 243h, the MFCs 241a to 241h, and so on are integrated. The integrated-type supply system 248 is connected to each of the gas supply pipes 232a to 232h. In addition, the integrated-type supply system 248 is configured such that operations of supplying various materials (various gases) into the gas supply pipes 232a to 232h (that is, the opening/closing operation of the valves 243a to 243h, the flow rate adjustment operation by the MFCs 241a to 241h, and the like) are controlled by a controller 121 which will be described later. The integrated-type supply system 248 is configured as an integral type or detachable-type integrated unit, and may be attached to and detached from the gas supply pipes 232a to 232h and the like on an integrated unit basis, so that the maintenance, replacement, extension, etc. of the integrated-type supply system 248 can be performed on an integrated unit basis.

The exhaust port 231a that exhausts an internal atmosphere of the process chamber 201 is provided below the sidewall of the reaction tube 203. As shown in FIG. 2, in a plane view, the exhaust port 231a is provided at a position opposing (facing) the nozzles 249a to 249c (the gas supply holes 250a to 250c) with the wafers 200 interposed therebetween. The exhaust port 231a may be provided from a lower portion of the sidewall of the reaction tube 203 to an upper portion thereof, that is, along the wafer arrangement region. An exhaust pipe 231 is connected to the exhaust port 231a. A vacuum exhaust device, for example, a vacuum pump 246, is connected to the exhaust pipe 231 via a pressure sensor 245, which is a pressure detector (pressure detection part) that detects the internal pressure of the process chamber 201, and an auto pressure controller (APC) valve 244, which is a pressure regulator (pressure adjustment part). The APC valve 244 is configured to perform or stop a vacuum-exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is provided under the manifold 209. The seal cap 219 is composed of, for example, a metal material such as SUS, and is formed in a disc shape. An O-ring 220b, which is a seal member making contact with the lower end of the manifold 209, is provided on an upper surface of the seal cap 219. A rotation mechanism 267 configured to rotate a boat 217, which will be described later, is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up and down.

A shutter 219s, which serves as a furnace opening cover configured to hermetically seal a lower end opening of the manifold 209 in a state where the seal cap 219 is lowered and the boat 217 is unloaded from the process chamber 201, is provided under the manifold 209. The shutter 219s is composed of, for example, a metal material such as SUS, and is formed in a disc shape. An O-ring 220c, which is a seal member making contact with the lower end of the manifold 209, is provided on an upper surface of the shutter 219s. The opening/closing operation (such as elevation operation, rotation operation, or the like) of the shutter 219s is controlled by a shutter-opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is composed of a heat resistant material such as quartz or SiC. Heat-insulating plates 218 composed of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that an interior of the process chamber 201 has a desired temperature distribution. The temperature sensor 263 is provided along the inner wall of the reaction tube 203.

Figure 3:
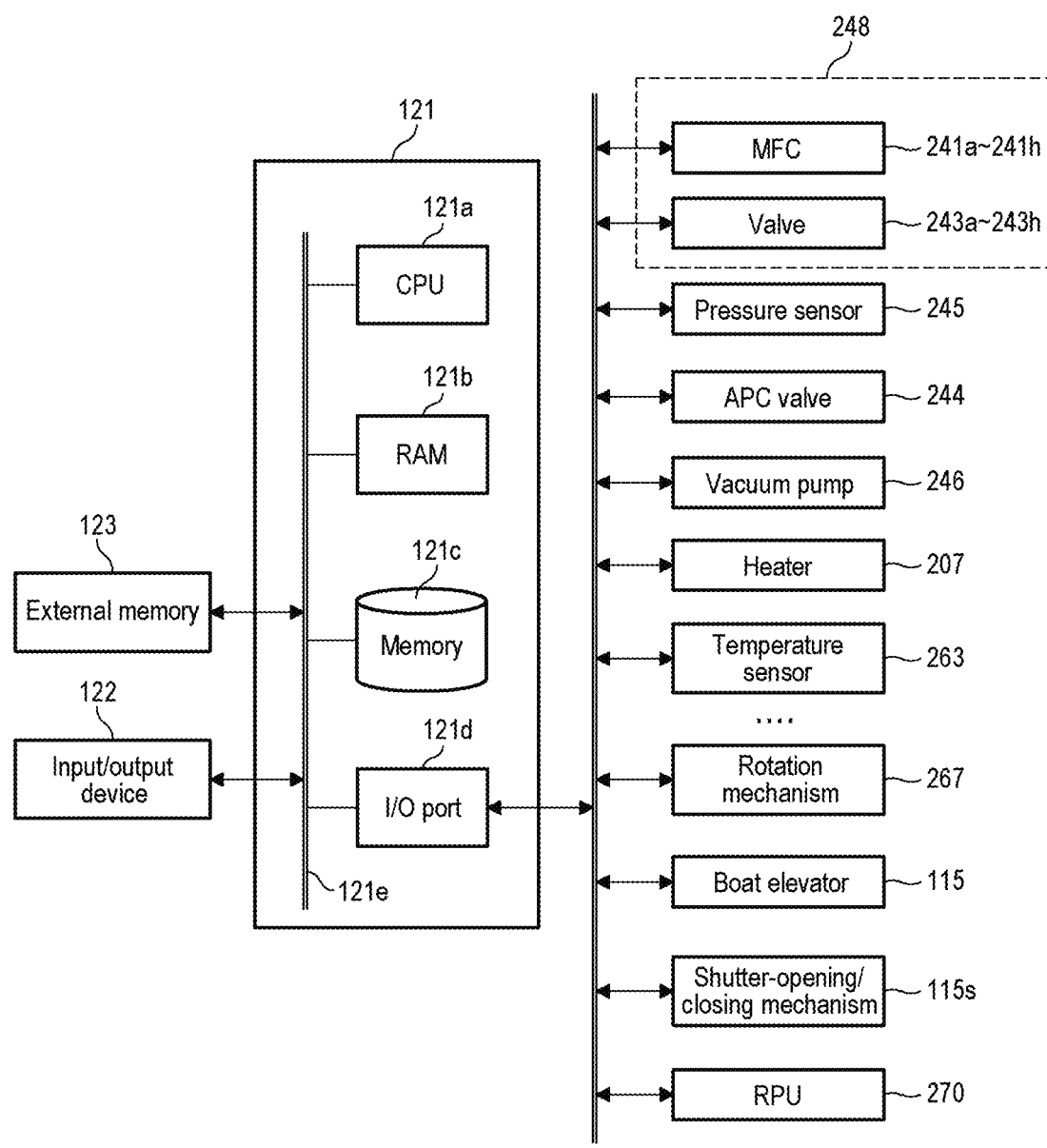
FIG. 3 is a schematic configuration diagram of a controller of the substrate processing apparatus suitably used in the embodiments of the present disclosure, in which a control system of the controller is shown in a block diagram.

As shown in FIG. 3, a controller 121, which is a control part (control means), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121. Further, an external memory 123 can be connected to the controller 121.

The memory 121c is configured by, for example, a flash memory, a hard disk drive (HDD), a solid state drive (SSD), or the like. A control program for controlling operations of a substrate processing apparatus, a process recipe in which sequences and conditions of substrate processing to be described later are written, etc. are readably stored in the memory 121c. The process recipe functions as a program for causing the controller 121 to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which programs or data read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter-opening/closing mechanism 115s, the RPU 270, and so on.

The CPU 121a is configured to read and execute the control program from the memory 121c. The CPU 121a is also configured to read the recipe from the memory 121c according to an input of an operation command from the input/output device 122. In addition, the CPU 121a is configured to control the flow-rate-adjusting operation of various kinds of materials (gases) by the MFCs 241a to 241h, the opening/closing operation of the valves 243a to 243h, the opening/closing operation of the APC valve 244, the pressure-adjusting operation performed by the APC valve 244 based on the pressure sensor 245, the actuating and stopping operation of the vacuum pump 246, the temperature-adjusting operation performed by the heater 207 based on the temperature sensor 263, the operations of rotating the boat 217 and adjusting the rotation speed of the boat 217 with the rotation mechanism 267, the operation of moving the boat 217 up and down by the boat elevator 115, the opening/closing operation of the shutter 219s by the shutter-opening/closing mechanism 115s, the operation of plasma excitation of a gas by the RPU 270, and so on, according to contents of the read recipe.

The controller 121 may be configured by installing, on the computer, the aforementioned program stored in the external memory 123. Examples of the external memory 123 may include a magnetic disk such as a HDD, an optical disc such as a CD, a magneto-optical disc such as a MO, a semiconductor memory such as a USB memory or a SSD, and the like. The memory 121c or the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer by using communication means such as the Internet or a dedicated line, instead of using the external memory 123.

(2) Substrate-Processing Process

As a process of manufacturing a semiconductor device by using the above-described substrate processing apparatus, an example of a method of processing a substrate, that is, a processing sequence for heat-treating a film formed on a wafer 200 as a substrate and removing the heat-treated film, will be described mainly with reference to FIGS. 4A to 4F. In the following description, a case where a SiO film as a first base and a SiN film as a second base are exposed on the surface of the wafer 200 will be described as a typical example of the wafer 200. In the following descriptions, the operations of the respective parts constituting the substrate processing apparatus are controlled by the controller 121.

A processing sequence shown in FIGS. 4A to 4F includes:

step A of forming a film on a wafer 200 by exposing the wafer 200 as a substrate to a film-forming agent under a first temperature;

step B of heat-treating the film under a second temperature higher than the first temperature;

step C of altering the heat-treated film by exposing the heat-treated film to an altering agent; and step D of removing the altered film by exposing the altered film to a removing agent.

Further, the processing sequence shown in FIGS. 4A to 4F further includes step F of supplying a modifying agent to the wafer 200 in which a SiO film as a first base and a SiN film as a second base are exposed on the surface of the wafer 200 before performing step A to form a film-forming inhibition layer on the surface of the SiO film as the first base. By performing step F before performing step A, in step A, a film can be selectively (preferentially) formed on the surface of the SiN film, among the SiO film as the first base and the SiN film as the second base.

The processing sequence in the present embodiments shows an example in which step A performs a cycle a predetermined number of times (n times, where n is an integer of 1 or more), the cycle including (non-simultaneously performing) step A1 of supplying a precursor as the film-forming agent to the wafer 200 and step A2 of supplying an oxidizing agent as the film-forming agent to the wafer 200, to further supply a catalyst as the film-forming agent to the wafer 200 in each of steps A1 and A2.

Further, the processing sequence in the present embodiments shows an example of further including step E of performing a predetermined process to the wafer 200 after performing step B and before performing step C.

In the present disclosure, for the sake of convenience, the above-described processing sequence may be denoted as follows. The same denotation may be used in modifications and other embodiments to be described later.

Modifying agent→(Precursor+Catalyst→Oxidizing agent+Catalyst)×n→Heat treatment→Predetermined process→Altering agent→Removing agent When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

The term "agent" used in the present disclosure includes at least one selected from the group of a gaseous substance and a liquefied substance. The liquefied substance includes a misty substance. That is, each of the modifying agent, the film-forming agent (precursor, oxidizing agent, or catalyst), the altering agent, and the removing agent may include a gaseous substance, a liquefied substance such as a misty substance, or both of them.

The term "layer" used in the present disclosure includes at least one selected from the group of a continuous layer and a discontinuous layer. For example, a film-forming inhibition layer may include a continuous layer, a discontinuous layer, or both of them as long as it is possible to cause a film-forming inhibition action.

(Wafer Charging and Boat Loading)

After the boat 217 is charged with a plurality of wafers 200 (wafer charging), the shutter 219s is moved by the shutter-opening/closing mechanism 115s and the lower end opening of the manifold 209 is opened (shutter open). Thereafter, as shown in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

Figure 4A:
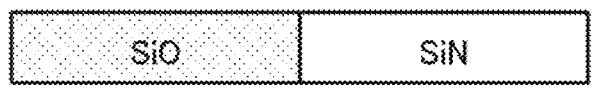
FIGS. 4A to 4F are diagrams showing a processing sequence according to embodiments of the present disclosure.

Further, as shown in FIG. 4A, in the wafer 200 which is charged in the boat 217, a SiO film as a first base and a SiN film as a second base are exposed on the surface of the wafer 200. In the wafer 200, the surface of the SiO film as the first base has an OH termination, which is an adsorption site, over the entire region (entire surface), while many regions of the surface of the SiN film as the second base do not have an OH termination. Further, the SiO film as the first base is an oxide film formed by, for example, a thermal oxide method or a chemical vapor deposition (CVD) method, and has higher film density and more strong Si—O bonds than a film after being altered in step C which will be described later.

(Pressure Adjustment and Temperature Adjustment)

The interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired temperature. At this time, the degree of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the process to the wafers 200 is completed.

(Step F)

After that, a modifying agent is supplied to the wafer 200, that is, the wafer 200 in which the SiO film as the first base and the SiN film as the second base are exposed on the surface of the wafer 200.

Specifically, the valve 243a is opened to allow the modifying agent to flow into the gas supply pipe 232a. The flow rate of the modifying agent is adjusted by the MFC 241a, and the modifying agent is supplied into the process chamber 201 via the nozzle 249a and is exhausted through the exhaust port 231a. In this operation, the modifying agent is supplied to the wafer 200 from the side of the wafer 200 (modifying agent supply). At this time, the valves 243f to 243h may be opened to allow an inert gas to be supplied into the process chamber 201 via the nozzles 249a to 249c, respectively.

Figure 4B:
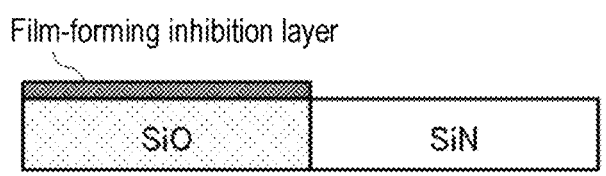

By supplying the modifying agent to the wafer 200 under the process conditions to be described later, at least a portion of the molecular structure of molecules constituting the modifying agent can be adsorbed on the surface of the SiO film as the first base, that is, the OH termination formed on the surface of the SiO film, so that the surface of the SiO film can be modified to form a film-forming inhibition layer. That is, in this step, by supplying the modifying agent reacting with the OH termination to the wafer 200, at least a portion of the molecular structures of the molecules constituting the modifying agent can be adsorbed on the surface of the SiO film having the OH termination, so that the surface of the SiO film can be modified to form the film-forming inhibition layer. As a result, as shown in FIG. 4B, the film-forming inhibition layer containing at least a portion of the molecular structure of the molecules constituting the modifying agent is formed on the surface of the SiO film.

The film-forming inhibition layer formed in this step contains at least the portion of the molecular structure of the molecules constituting the modifying agent, which is a residue derived from the modifying agent. In step A to be described later, the film-forming inhibition layer prevents the adsorption of the precursor (film-forming agent) on the surface of the SiO film to inhibit (suppress) the progress of a film-forming reaction on the surface of the SiO film.

As at least the portion of the molecular structure of the molecules constituting the modifying agent, for example, a trialkylsilyl group such as a trimethylsilyl group (—SiMe$_3$) or a triethylsilyl group (—SiEt$_3$) can be exemplified. In these cases, Si of the trimethylsilyl group or the triethylsilyl group is bonded to O of the OH termination, so that the surface of the SiO film is terminated by an alkyl group such as a methyl group or an ethyl group. The alkyl group (alkylsilyl group) such as the methyl group (trimethylsilyl group) or the ethyl group (triethylsilyl group), which terminates the outermost surface of the SiO film, constitutes the film-forming inhibition layer which prevents the adsorption of the precursor (film-forming agent) on the surface of the SiO film to inhibit (suppress) the progress of the film-forming reaction on the surface of the SiO film in step A to be described later.

Here, the film-forming inhibition layer (also referred to as a film-forming suppressive layer) may be referred to as an inhibitor because it has a film-forming inhibition action. In addition, the term "inhibitor" used in the present disclosure may mean not only a film-forming inhibition layer, but also a modifying agent and a residue derived from the modifying agent, for example, at least a portion of the molecular structure of molecules constituting the modifying agent, and further may mean to be used as the general term for all of them.

In this step, at least a portion of the molecular structure of the molecules constituting the modifying agent may be adsorbed on a portion of the surface of the SiN film which is the second base, but the amount of adsorption thereof is small and the amount of adsorption on the surface of the SiO film, which is the first base, is overwhelmingly large. Such selective (preferential) adsorption is possible because the process conditions in this step are the conditions in which the modifying agent does not undergo gas phase decomposition in the process chamber 201. This is also possible because the surface of the SiO film is OH-terminated over the entire region, whereas many regions on the surface of the SiN film are not OH-terminated. In this step, since the modifying agent does not undergo the gas phase decomposition in the process chamber 201, at least a portion of the molecular structure of the molecules constituting the modifying agent is not multiple-deposited on the surface of the SiN film, and at least a portion of the molecular structure of the molecules constituting the modifying agent is selectively adsorbed on the surface of the SiO film among the SiO film and the SiN film, whereby the surface of the SiO film is selectively terminated by at least the portion of the molecular structure of the molecules constituting the modifying agent.

The process conditions for supplying the modifying agent in step F are exemplified as follows.

Processing temperature: room temperature (25 degrees C.) to 500 degrees C., specifically room temperature (25 degrees C.) to 250 degrees C.

Processing pressure: 5 to 2,000 Pa, specifically 10 to 1,000 Pa

Modifying agent supply flow rate: 0.001 to 3 slm, specifically 0.001 to 0.5 slm

Modifying agent supply time: 1 second to 120 minutes, specifically 30 seconds to 60 minutes Inert gas supply flow rate (for each gas supply pipe): 0 to 20 slm In the present disclosure, the notation of a numerical range such as "5 to 2,000 Pa" means that the lower limit value and the upper limit value are included in the range. Therefore, for example, "5 to 2,000 Pa" means "5 Pa or more and 2,000 Pa or less." The same applies to other numerical ranges. In the present disclosure, the processing temperature means the temperature of the wafer 200 or the internal temperature of the process chamber 201, and the processing pressure means the internal pressure of the process chamber 201. Further, the gas supply flow rate of 0 slm means a case where no substance (gas) is supplied. These apply equally to the following description.

After selectively forming the film-forming inhibition layer on the surface of the SiO film which is the first base, the valve 243a is closed to stop the supply of the modifying agent into the process chamber 201. Then, the interior of the process chamber 201 is vacuum-exhausted to remove a gaseous substance and the like remaining in the process chamber 201 from the process chamber 201. At this time, the valves 243f to 243h are opened to allow an inert gas to be supplied into the process chamber 201 via the nozzles 249a to 249c. The inert gas supplied from the nozzles 249a to 249c acts as a purge gas, whereby the interior of the process chamber 201 is purged (purging).

The process conditions for purging in step F are exemplified as follows.

Processing pressure: 1 to 30 Pa

Inert gas supply flow rate (for each gas supply pipe): 0.5 to 20 slm

Inert gas supply time: 1 to 120 seconds, specifically 1 to 60 seconds

The processing temperature for purging in this step is preferably the same as the processing temperature for supplying the modifying agent.

As the modifying agent, for example, a compound having a structure in which an amino group is directly bonded to silicon (Si) or a compound having a structure in which an amino group and an alkyl group are directly bonded to silicon (Si) can be used.

Examples of the modifying agent may include (dimethylamino)trimethylsilane $((CH_3)_2NSi(CH_3)_3$, abbreviation: DMATMS), (diethylamino)triethylsilane $((C_2H_5)_2NSi(C_2H_5)_3$, abbreviation: DEATES), (dimethylamino)triethylsilane $((CH_3)_2NSi(C_2H_5)_3$, abbreviation: DMATES), (diethylamino)trimethylsilane $((C_2H_5)_2NSi(CH_3)_3$, abbreviation: DEATMS), (dipropylamino)trimethylsilane $((C_3H_7)_2NSi(CH_3)_3$, abbreviation: DPATMS), (dibutylamino)trimethylsilane $((C_4H_9)_2NSi(CH_3)_3$, abbreviation: DBATMS), (trimethylsilyl)amine $((CH_3)_3SiNH_2$, abbreviation: TMSA), (triethylsilyl)amine $((C_2H_5)_3SiNH_2$, abbreviation: TESA), (dimethylamino)silane $((CH_3)_2NSiH_3$, abbreviation: DMAS), (diethylamino)silane $((C_2H_5)_2NSiH_3$, abbreviation: DEAS), (dipropylamino)silane $((C_3H_7)_2NSiH_3$, abbreviation: DPAS), (dibutylamino)silane $((C_4H_9)_2NSiH_3$, abbreviation: DBAS), and the like. One or more of these gases can be used as the modifying agent.

Further, examples of the modifying agent may include bis(dimethylamino)dimethylsilane $([(CH_3)_2N]_2Si(CH_3)_2$, abbreviation: BDMADMS), bis(diethylamino)diethylsilane $([(C_2H_5)_2N]_2Si(C_2H_5)_2$, abbreviation: BDEADES), bis(dimethylamino)diethylsilane $([(CH_3)_2N]_2Si(C_2H_5)_2$, abbreviation: BDMADES), bis(diethylamino)dimethylsilane $([(C_2H_5)_2N]_2Si(CH_3)_2$, abbreviation: BDEADMS), bis(dimethylamino)silane $([(CH_3)_2N]_2SiH_2$, abbreviation: BDMAS), bis(diethylamino)silane $([(C_2H_5)_2N]_2SiH_2$, abbreviation: BDEAS), bis(dimethylaminodimethylsilyl)ethane $([(CH_3)_2N(CH_3)_2Si]_2C_2H_6$, abbreviation: BDMADMSE), bis(dipropylamino)silane $([(C_3H_7)_2N]_2SiH_2$, abbreviation: BDPAS), bis(dibutylamino)silane $([(C_4H_9)_2N]_2SiH_2$, abbreviation: BDBAS), bis(dipropylamino)dimethylsilane $([(C_3H_7)_2N]_2Si(CH_3)_2$, abbreviation: BDPADMS), bis(dipropylamino)diethylsilane $((C_3H_7)_2N]_2Si(C_2H_5)_2$, abbreviation: BDPADES), (dimethylsilyl)diamine $((CH_3)_2Si(NH_2)_2$, abbreviation: DMSDA), (diethylsilyl)diamine $((C_2H_5)_2Si(NH_2)_2$, abbreviation: DESDA), (dipropylsilyl)diamine $((C_3H_7)_2Si(NH_2)_2$, abbreviation: DPSDA), bis(dimethylaminodimethylsilyl)methane $([(CH_3)_2N(CH_3)_2Si]_2CH_2$, abbreviation: BDMADMSM), bis(dimethylamino)tetramethyldisilane $([(CH_3)_2N]_2(CH_3)_4Si_2$, abbreviation: BDMATMDS), and the like. One or more of these gases can be used as the modifying agent.

As the inert gas, a nitrogen ($N_2$) gas or a rare gas such as an argon (Ar) gas, a helium (He) gas, a neon (Ne) gas, or a xenon (Xe) gas can be used. One or more of these gases can be used as the inert gas. This point is the same in each step to be described later.

(Step A)

After performing step F, by exposing the wafer 200 to the film-forming agent under a first temperature, a film is formed on the surface of the SiN film as the second base of the wafer 200. That is, in this step, by exposing the wafer 200 to the film-forming agent that reacts with the surface of the SiN film, a film is selectively (preferentially) formed on the surface of the SiN film. Specifically, this step sequentially performs the following steps A1 and A2. In the following example, the film-forming agent includes a precursor, an oxidizing agent, and a catalyst.

In this step (step A1 and step A2), the output of the heater 207 is adjusted to set the internal temperature of the process chamber 201, that is, the temperature (first temperature) of the wafer 200, to be lower than the temperature (second temperature) of the wafer 200 in step B to be described later. Further, in this step (step A1 and step A2), the output of the heater 207 is adjusted to set the temperature (first temperature) of the wafer 200 to be equal to or lower than the temperature of the wafer 200 in step F, preferably lower than the temperature of the wafer 200 in step F.

[Step A1]

In this step, a precursor (precursor gas) and a catalyst (catalyst gas) are supplied as a film-forming agent to the wafer 200 after performing step F, that is, the wafer 200 after selectively forming the film-forming inhibition layer on the surface of the SiO film which is the first base. As a result, the wafer 200 can be exposed to the precursor (precursor gas) and the catalyst (catalyst gas).

Specifically, the valves 243b and 243d are opened to allow the precursor and the catalyst to flow into the gas supply pipes 232b and 232d, respectively. The flow rates of the precursor and the catalyst are adjusted by the MFCs 241b and 241d, respectively, and the precursor and the catalyst are supplied into the process chamber 201 via the nozzles 249b and 249a, respectively, mixed in the process chamber 201, and exhausted through the exhaust port 231a. In this operation, the precursor and the catalyst are supplied to the wafer 200 from the side of the wafer 200 (precursor+catalyst supply). At this time, the valves 243f to 243h may be opened to allow an inert gas to be supplied into the process chamber 201 via the nozzles 249a to 249c, respectively.

By supplying the precursor and the catalyst to the wafer 200 under the process conditions to be described later, it is possible to selectively chemisorb at least a portion of the molecular structure of molecules constituting the precursor on the surface of the SiN film which is the second base while suppressing the chemisorption of at least the portion of the molecular structure of the molecules constituting the precursor on the surface of the SiO film which is the first base. As a result, a first layer is selectively formed on the surface of the SiN film. The first layer contains at least a portion of the molecular structure of the molecules constituting the precursor, which is residues derived from the precursor. That is, the first layer contains at least a portion of atoms constituting the precursor.

In this step, by supplying the catalyst together with the precursor, it is possible to proceed with the above-mentioned reaction in a non-plasma atmosphere and under low temperature conditions as will be described later. In this way, by forming the first layer in the non-plasma atmosphere and under the low temperature conditions as will be described later, it is possible to maintain molecules and atoms constituting the film-forming inhibition layer formed on the surface of the SiO film without extinguishing (desorbing) them from the surface of the SiO film.

Further, by forming the first layer in the non-plasma atmosphere and under the low temperature conditions as will be described later, the precursor can be prevented from being thermally decomposed (gas phase-decomposed), that is, autolyzed, in the process chamber 201. As a result, it is possible to prevent multiple deposition of at least a portion of the molecular structure of molecules constituting the precursor on the surface of the SiO film and the surface of the SiN film and selectively adsorb the precursor on the surface of the SiN film.

In this step, at least a portion of the molecular structure of the molecules constituting the precursor may be adsorbed on a portion of the surface of the SiO film, but the amount of adsorption thereof is very small, which is much smaller than the amount of adsorption of at least a portion of the molecular structure of the molecules constituting the precursor on the surface of the SiN film. Such selective (preferential) adsorption is possible because the process conditions in this step are the low temperature conditions as will be described later and the conditions in which the precursor does not undergo vapor phase decomposition in the process chamber 201. Further, this is also possible because the film-forming inhibition layer is formed over the entire region of the SiO film, whereas the film-forming inhibition layer is not formed in many regions on the surface of the SiN film.

The process conditions for supplying the precursor and the catalyst in step A1 are exemplified as follows.

Processing temperature (first temperature): room temperature (25 degrees C.) to 120 degrees C., specifically room temperature to 90 degrees C.
Processing pressure: 133 to 1,333 Pa
Precursor supply flow rate: 0.001 to 2 slm
Catalyst supply flow rate: 0.001 to 2 slm
Inert gas supply flow rate (for each gas supply pipe): 0 to 20 slm
Each gas supply time: 1 to 120 seconds After selectively forming the first layer on the surface of the SiN film which is the second base, the valves 243b and 243d are closed to stop the supply of the precursor and the catalyst into the process chamber 201, respectively. Then, a gaseous substance and the like remaining in the process chamber 201 are removed from the process chamber 201 (purging) according to the same processing procedure and process conditions as in the purging in step A. It is preferable that the processing temperature for purging in this step is the same as the processing temperature for supplying the precursor and the catalyst.

An example of the precursor may include a Si-, carbon (C)-, and halogen-containing gas. Halogen includes chlorine (Cl), fluorine (F), bromine (Br), iodine (I), and the like. It is preferable that the Si-, C-, and halogen-containing gas contains halogen in the form of a chemical bond between Si and halogen. It is preferable that the Si-, C-, and halogen-containing gas contains C in the form of a Si—C bond. An example of the Si-, C-, and halogen-containing gas may include a silane-based gas containing Si, Cl, and an alkylene group and containing a Si—C bond, that is, an alkylenechlorosilane-based gas. The alkylene group includes a methylene group, an ethylene group, a propylene group, a butylene group, and the like. It is preferable that the alkylenechlorosilane-based gas contains Cl in the form of a Si—Cl bond and C in the form of a Si—C bond.

Examples of the Si-, C-, and halogen-containing gas may include an alkylenechlorosilane-based gas such as a bis(trichlorosilyl)methane (($SiCl_3$)$_2CH_2$, abbreviation: BTCSM) gas or a 1,2-bis(trichlorosilyl)ethane (($SiCl_3$)$_2C_2H_4$, abbreviation: BTCSE) gas. Further, examples of the Si-, C-, and halogen-containing gas may include an alkylchlorosilane-based gas such as a 1,1,2,2-tetrachloro-1,2-dimethyldisilane (($CH_3$)$_2Si_2Cl_4$, abbreviation: TCDMDS) gas or a 1,2-dichloro-1,1,2,2-tetramethyldisilane (($CH_3$)$_4Si_2Cl_2$, abbreviation: DCTMDS) gas, or a gas having a cyclic structure composed of Si and C and containing halogen such as a 1,1,3,3-tetrachloro-1,3-disilacyclobutane ($C_2H_4Cl_4Si_2$, abbreviation: TCDSCB) gas. One or more of these gases can be used as the precursor.

As the catalyst, for example, an amine-based gas containing C, nitrogen (N), and hydrogen (H) can be used. Examples of the amine-based gas may include a cyclic amine-based gas such as a pyridine ($C_5HSN$) gas, an aminopyridine ($C_5H_6N_2$) gas, a picoline ($C_6H_7N$) gas, a rutidine ($C_7H_9N$) gas, a piperazine ($C_4H_{10}N_2$) gas, or a piperidine ($C_5H_{11}N$) gas, a chain amine-based gas such as a triethylamine (($C_2H_5$)$_3N$, abbreviation: TEA) gas or a diethylamine (($C_2H_5$)$_2NH$, abbreviation: DEA) gas, or the like. In addition to these, for example, an ammonia ($NH_3$) gas or the like can be used as the catalyst. One or more of these gases can be used as the catalyst. This point is the same in step A2 to be described later.

[Step A2]

After step A1 is completed, an oxidizing agent (oxidizing gas) and a catalyst (catalyst gas) are supplied as a film-forming agent to the wafer 200, that is, the wafer 200 after selectively forming the first layer on the surface of the SiN film as the second base. As a result, the wafer 200 can be exposed to the oxidizing agent (oxidizing gas) and the catalyst (catalyst gas).

Specifically, the valves 243c and 243d are opened to allow the oxidizing agent and the catalyst to flow into the gas supply pipes 232c and 232d, respectively. The flow rates of the oxidizing agent and the catalyst are adjusted by the MFCs 241c and 241d, respectively, and the oxidizing agent and the catalyst are supplied into the process chamber 201 via the nozzles 249c and 249a, respectively, mixed in the process chamber 201, and exhausted through the exhaust port 231a. In this operation, the oxidizing agent and the catalyst are supplied to the wafer 200 from the side of the wafer 200 (oxidizing agent+catalyst supply). At this time, the valves 243f to 243h may be opened to allow an inert gas to be supplied into the process chamber 201 via the nozzles 249a to 249c, respectively.

By supplying the oxidizing agent and the catalyst to the wafer 200 under the process conditions to be described later, it is possible to oxidize at least a portion of the first layer formed on the surface of the SiN film as the second base in step A1. As a result, a second layer formed by oxidizing the first layer is formed on the surface of the SiN film.

In this step, by supplying the catalyst together with the oxidizing agent, it is possible to proceed with the above-mentioned reaction in a non-plasma atmosphere and under low temperature conditions as will be described later. In this way, by forming the second layer in the non-plasma atmosphere and under the low temperature conditions as will be described later, it is possible to maintain molecules and atoms constituting the film-forming inhibition layer formed on the surface of the SiO film, which is the first base, without extinguishing (desorbing) them from the surface of the SiO film.

The process conditions for supplying the oxidizing agent and the catalyst in step A2 are exemplified as follows.

Processing temperature (first temperature): room temperature (25 degrees C.) to 120 degrees C., specifically room temperature to 100 degrees C.

Processing pressure: 133 to 1,333 Pa

Oxidizing agent supply flow rate: 0.001 to 2 slm

Catalyst supply flow rate: 0.001 to 2 slm

Inert gas supply flow rate (for each gas supply pipe): 0 to 20 slm

Each gas supply time: 1 to 120 seconds

After oxidizing (converting) the first layer formed on the surface of the SiN film as the second base, into the second layer, the valves 243c and 243d are closed to stop the supply of the oxidizing agent and the catalyst into the process chamber 201, respectively. Then, a gaseous substance and the like remaining in the process chamber 201 are removed from the process chamber 201 (purging) according to the same processing procedure and process conditions as in the purging in step A. It is preferable that the processing temperature for purging in this step is the same as the processing temperature for supplying the oxidizing agent and the catalyst.

As the oxidizing agent, for example, an oxygen (O)- and H-containing gas can be used. Examples of the O- and H-containing gas may include water vapor ($H_2O$ gas), a hydrogen peroxide ($H_2O_2$) gas, a hydrogen ($H_2$) gas+oxygen ($O_2$) gas, a $H_2$ gas+ozone ($O_3$) gas, and the like. One or more of these gases can be used as the oxidizing agent.

In the present disclosure, the description of two gases such as "$H_2$ gas+02 gas" together means a mixed gas of $H_2$ gas and $O_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

As the catalyst, for example, the same catalysts as the various catalysts exemplified in the above-described step A1 can be used.

[Performing Predetermined Number of Times]

Figure 4C:
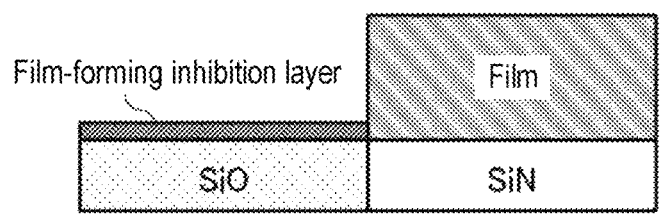

By performing a cycle a predetermined number of times (n time, where n is an integer of 1 or more), the cycle including non-simultaneously, that is, without synchronization, performing the above-described steps A1 and A2, a film can be selectively (preferentially) formed on the surface of the SiN film as the second base of the wafer 200, as shown in FIG. 4C. The above cycle may be repeated a plurality of times. That is, the thickness of the second layer formed per cycle may be set to be smaller than a desired film thickness, and the above cycle may be repeated multiple times until the thickness of a film formed by stacking second layers reaches the desired film thickness.

As described above, by repeating the above cycle a plurality of times, the film can be selectively grown on the surface of the SiN film as the second base. At this time, since the film-forming inhibition layer is formed on the surface of the SiO film as the first base, it is possible to suppress the growth of the film on the surface of the SiO film. That is, by repeating the above cycle a plurality of times, it is possible to promote the growth of the film on the surface of the SiN film while suppressing the growth of the film on the surface of the SiO film.

The film formed (selectively grown) on the surface of the SiN film in this step preferably contains C. The film containing C has a feature of high etching resistance. Further, the film containing C can have higher etching resistance by heat treatment in step B which will be described later. From these facts, for example, in step E which will be described later, it becomes possible to use the film containing C as a hard mask. Further, for example, when the above-mentioned precursor, oxidizing agent, and catalyst are used, a film containing Si, C, and O, preferably a silicon oxycarbide film (SiOC film), can be selectively grown as a film on the surface of the SiN film as the second base.

Further, when steps A1 and A2 are performed, since the film-forming inhibition layer formed on the surface of the SiO film is maintained on the surface of the SiO film, as described above, the growth of the film on the surface of the SiO film can be suppressed. However, when the formation of the film-forming inhibition layer on the surface of the SiO film is insufficient for some reason, the formation and growth of the film on the surface of the SiO film may occur very slightly. However, even in this case, the thickness of the film formed on the surface of the SiO film as the first base is much thinner than the thickness of the film formed on the surface of the SiN film as the second base. As used herein, "selectively (preferentially) forming a film on the surface of the second base" means to include not only a case where a film is formed only on the surface of the second base with no film formed on the surface of the first base, but also a case where a very thin film is formed on the surface of the first base but a much thicker film is formed on the surface of the second base.

(Step B)

After performing step A, the film formed on the surface of the SiN film as the second base of the wafer 200 is heat-treated under a second temperature higher than the first temperature. At this time, it is also possible to heat-treat the film-forming inhibition layer formed on the surface of the SiO film as the first base of the wafer 200.

Specifically, in this step, the output of the heater 207 is adjusted to set the internal temperature of the process chamber 201, that is, the temperature (second temperature) of the wafer 200 after selectively forming the film on the surface of the SiN film, to be higher than the temperature (first temperature) of the wafer 200 in step A.

According to this step, by heat-treating (annealing) the film formed on the surface of the SiN film of the wafer 200 under the second temperature higher than the first temperature, impurities contained in the film formed in step A can be removed, defects in the film can be repaired, and the film can be hardened. By hardening the film, the processing resistance of the film, that is, the etching resistance, can be improved. That is, in this step, the etching resistance of the film can be improved by heat-treating the film formed on the surface of the SiN film. In this way, by improving the etching resistance (processing resistance) of the film by the heat treatment, it becomes difficult to remove the film after the heat treatment. Therefore, after performing this step, step C and step D to be described later are particularly effective.

Further, according to this step, it is also possible to heat-treat (anneal) the film-forming inhibition layer formed on the surface of the SiO film of the wafer 200 under the second temperature. This makes it possible to desorb and/or invalidate at least a portion of the film-forming inhibition layer formed on the surface of the SiO film. The invalidation of the film-forming inhibition layer means that the arrangement structure of atoms, the molecular structure of the molecules constituting the film-forming inhibition layer, etc. are changed to make it possible to adsorb the film-forming agent on the surface of the SiO film, which is the base, or make the reaction between the surface of the SiO film, which is the base, and the film-forming agent.

Figure 4D:
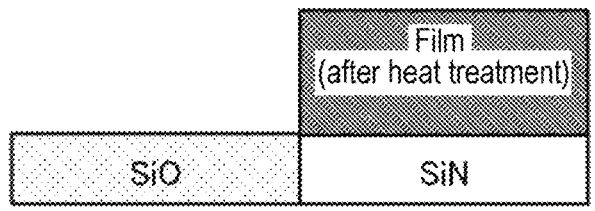
Figure 4E:
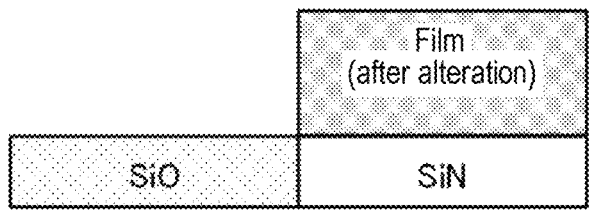

As described above, by performing this step, as shown in FIG. 4D, the film formed on the surface of the SiN film as the second base of the wafer 200 is hardened by the heat treatment, and at least a portion of the film-forming inhibition layer formed on the surface of the SiO film as the first base is desorbed and/or invalidated. That is, by performing this step, the heat-treated film exists on the surface of the SiN film as the second base, and at least a portion of the surface of the SiO film as the first base is exposed. FIG. 4D shows an example in which the film-forming inhibition layer formed on the surface of the SiO film as the first base is desorbed and removed to expose the surface of the SiO film as the first base.

Further, the heat treatment in this step may be performed in a state where an inert gas is supplied into the process chamber 201, or may be performed in a state where a reactive substance such as an oxidizing agent (oxidizing gas) is supplied into the process chamber 201. In this case, the inert gas and the reactive substance such as the oxidizing agent (oxidizing gas) are also referred to as an assist substance.

The process conditions for heat treatment in step B are exemplified as follows.

Processing temperature: 120 to 1,000 degrees C., specifically 400 to 700 degrees C.
Processing pressure: 1 to 120,000 Pa
Processing time: 1 to 18,000 seconds
Assist substance supply flow rate: 0 to 50 slm In this step, the second temperature is set to be higher than the first temperature in step A. Specifically, for example, it is preferable to satisfy the relationship that the first temperature is 100 degrees C. or lower and the second temperature is 300 degrees C. or higher. It is more preferable to satisfy the relationship that the first temperature is the room temperature (25 degrees C. or higher and 100 degrees C. or lower and the second temperatures is 300 degrees C. or higher and 1,000 degrees C. or lower. By satisfying the above relationship between the first temperature and the second temperature, the film formed on the wafer 200 under the low temperature in step A can be sufficiently hardened in this step, so that the etching resistance of the film can be sufficiently increased. As a result, the heat-treated film after performing this step becomes a film that is more difficult to be removed (etched). Therefore, after performing this step, step C and step D, which will be described later, are particularly effective.

When the first temperature in step A is 100 degrees C. or lower (preferably the room temperature or higher and 100 degrees C. or lower), if the second temperature in step B is lower than 300 degrees C., the film becomes insufficiently hardened, so that it may not be possible to sufficiently increase the etching resistance of the film. In contrast, when the first temperature is 100 degrees C. or lower and the second temperature is 300 degrees C. or higher, the film can be sufficiently hardened, so that the etching resistance of the film can be sufficiently increased. Further, if the second temperature in step B is set to a temperature exceeding 1,000 degrees C., the influence of the thermal history of the wafer 200 becomes large, so that the wafer 200 and a film existing on the surface thereof may be damaged. In contrast, by setting the second temperature to a temperature of 1,000 degrees C. or lower, it is possible to improve the thermal history of the wafer 200 to avoid the damage to the wafer 200 and the film existing on the surface thereof. From these facts, when the first temperature in step A is 100 degrees C. or lower, it is preferable that the second temperature in step B is 300 degrees C. or higher and 1,000 degrees C. or lower.

(Step E)

After performing step B, a predetermined process is performed to the wafer 200, that is, the wafer 200 in which the heat-treated film exists on the surface of the SiN film as the second base. The predetermined process includes at least one selected from the group of etching, film formation, and treatment. The predetermined process is, for example, a process for a film, a layer, or a base other than the heat-treated film formed on the surface of the SiN film of the wafer 200. The predetermined process may be applied to the heat-treated film formed on the surface of the SiN film of the wafer 200.

(Etching)

In this step, when etching is performed as the predetermined process, an etching process is performed to the wafer 200, that is, the wafer 200 having the heat-treated film on the surface of the wafer 200. Here, it is preferable to perform the etching process by using the heat-treated film existing on the surface of the wafer 200, that is, the heat-treated film formed on the surface of the SiN film, as a hard mask. Therefore, in a state before the etching process, it is preferable that a plurality of types of films including the heat-treated film exist on the surface of the wafer 200, and among the plurality of types of films, a film other than the heat-treated film can be removed by etching. In this way, in this step, by performing the etching as the predetermined process, it is possible to selectively remove the film other than the heat-treated film existing on the surface of the wafer 200. In this case, since the heat-treated film acts as a hard mask, it is possible to hold the SiN film as the second base of the wafer 200 without etching.

A method of etching process is not particularly limited as long as it is possible to remove a film which is the etching target. For example, in this step, dry etching using an etching agent can be performed as the predetermined process. As the dry etching, the same method as the film removal in step D to be described later can be used. Further, as the etching agent, various F-containing gases as the removing agent exemplified in step D to be described later can be used. The etching agent can be supplied by using the above-mentioned removing agent supply system.

(Film Formation)

In this step, when film formation is performed as the predetermined process, a film-forming process is performed to the wafer 200, that is, the wafer 200 having the heat-treated film on the surface of the wafer 200. In this film-forming process, it is preferable to form a film whose material is different from that of the heat-treated film, particularly a film which is less likely to be altered (oxidized) than the heat-treated film, or a film which is not altered (oxidized), on the surface of the wafer 200.

A method of film-forming process is not particularly limited as long as it is possible to form a desired film on the surface of the wafer 200. For example, in this step, as the predetermined process, it is possible to form a film that is less likely to be altered (oxidized) than the heat-treated film or a film that is not altered (oxidized) in step C to be described later. Here, as the film-forming process, the same method as that for forming the film in the above-described step A can be used. Further, as a film-forming agent used for the film-forming process, various film-forming agents can be used depending on the component (composition) of a film to be formed. The film-forming agent can be supplied by using the above-mentioned film-forming agent supply system.

(Treatment)

In this step, when treatment is performed as the predetermined process, the treatment is performed to the wafer 200, that is, the wafer 200 having the heat-treated film on the surface of the wafer 200. The treatment may be performed on a film, a layer, or a base other than the heat-treated film, or may be performed on the heat-treated film. The treatment can remove impurities contained in a film, a layer, and a base to be treated, repair defects, and densify and harden the film, the layer, and the base to be treated.

A method of treatment is not particularly limited and may be, for example, plasma treatment, thermal treatment, or both of them. As the plasma treatment, for example, the same treatment as oxygen plasma treatment (plasma oxidation treatment) as performed in step C to be described later may be performed, nitrogen plasma treatment (plasma nitridation treatment) may be performed, or inert gas plasma treatment may be performed. As the thermal treatment, for example, the same treatment as the heat treatment (annealing) as performed in step B can be performed.

(Step C)

After performing step E, the heat-treated film formed on the surface of the SiN film as the second base of the wafer 200 is altered by exposing the heat-treated film to an altering agent.

In this step, the altering agent is supplied to the wafer 200 after performing step E, that is, the wafer 200 after performing the predetermined process. As a result, the heat-treated film formed on the surface of the SiN film of the wafer 200 can be exposed to the altering agent. When supplying the altering agent to the heat-treated film, the altering agent may be supplied without or with plasma-exciting the altering agent. Further, the altering agent may be supplied without plasma-exciting the altering agent and then supplied with plasma-exciting the altering agent, or the altering agent may be supplied with plasma-exciting the altering agent and then supplied without plasma-exciting the altering agent.

Specifically, the valve 243c is opened to allow the altering agent to flow into the gas supply pipe 232c. The flow rate of the altering agent is adjusted by the MFC 241c, and the altering agent is supplied into the process chamber 201 via the nozzle 249c and is exhausted through the exhaust port 231a. In this operation, the altering agent is supplied to the wafer 200 from the side of the wafer 200. At this time, the valves 243f to 243h may be opened to allow an inert gas to be supplied into the process chamber 201 via the nozzles 249a to 249c, respectively. Further, at this time, the altering agent may be supplied with excitation to a plasma state by the RPU 270.

By supplying the altering agent to the wafer 200 under the process conditions to be described later, it is possible to alter at least a portion of the heat-treated film formed on the surface of the SiN film. In this step, the film can be altered to reduce the etching resistance of the film after the etching resistance is increased by the heat treatment in step B. An example of a method of altering the film to reduce the etching resistance may include oxidation. When the film is altered by the oxidation, in this step, at least a portion of the heat-treated film is oxidized by using an oxidizing agent as the altering agent, so that the film can be altered to reduce the etching resistance of the film. In this step, by reducing the etching resistance of the heat-treated film by using the oxidizing agent as the altering agent, it is possible to effectively alter the heat-treated film to a film that is easily removed by a removing agent in step D to be described later, that is, a film that is highly reactive with the removing agent.

If a plurality of types of films including the heat-treated film exist on the surface of the wafer 200 in a state before performing this step, in this step, it is preferable to selectively alter (oxidize) the heat-treated film among the plurality of types of films. In this way, when the plurality of types of films including the heat-treated film exist on the surface of the wafer 200 in the state before performing this step, it is possible to selectively remove the altered film among the plurality of types of films in step D to be described later by selectively altering the heat-treated film. Here, some or all of films other than the heat-treated film can be formed (film-formed) by, for example, film formation as the predetermined process performed in the above-described step E.

Further, in the state before performing this step, when the plurality of types of films including the heat-treated film exist on the surface of the wafer 200, it is preferable that the films other than the heat-treated film are films that are more difficult to be altered (oxidized) than the heat-treated film, or films that are not altered (oxidized). This makes it possible to selectively alter (oxidize) the heat-treated film among the plurality of types of films by using the selectivity of this alteration (oxidation). In this step, at least a portion of the films other than the heat-treated film may be altered together with the heat-treated film, but due to the selectivity of alteration (oxidation), the heat-treated film is altered predominantly (preferentially) while the films other than the heat-treated film are altered slightly. As a result, even in that case, the heat-treated film can be selectively altered (oxidized). In particular, when the films other than the heat-treated film contain a SiO film, the alteration (oxidation) in this step hardly affects the SiO film. In this case, the heat-treated film can be altered (oxidized) with extremely high selectivity.

As described above, in the state before performing this step, even when the plurality of types of films other than the heat-treated film exist on the surface of the wafer 200, if the films other than the heat-treated film are films that are more difficult to be altered (oxidized) than the heat-treated film or films that are not altered (oxidized), the heat-treated film among the plurality of types of films can be selectively altered (oxidized) by using the selectivity of alteration (oxidation).

In this step, for example, when the heat-treated film formed on the surface of the SiN film is a film containing C such as a SiOC film, it is preferable to oxidize the heat-treated film to remove C in the film or reduce the C concentration (C content) in the film. By removing C in the film or reducing the C concentration in the film, it is possible to effectively alter the heat-treated film to a film that is easily removed by the removing agent in step D to be described later by reducing the etching resistance of the heat-treated film. When the film formed in step A is the SiOC film, in this step, the heat-treated SiOC film can be oxidized (C in the heat-treated SiOC film is removed) to be altered into a SiO film.

As described above, by performing this step, as shown in FIG. 4E, the heat-treated film on the surface of the SiN film as the second base of the wafer 200 is altered (oxidized), and the altered film exists on the surface of the SiN film.

The process conditions for supplying the altering agent in step C are exemplified as follows.

Processing temperature: 100 to 1,000 degrees C., specifically 150 to 800 degrees C.
Processing pressure: 1 to 13,332 Pa, specifically 100 to 1,333 Pa
Altering agent supply flow rate: 0.1 to 10 slm, specifically 0.5 to 5 slm
Altering agent supply time: 1 to 3,600 seconds, specifically 10 to 600 seconds, more specifically 15 to 60 seconds
RF power: 0 to 1,500 W
Other process conditions can be the same as the process conditions in step F.

After the heat-treated film on the surface of the wafer 200 is altered, the valve 243c is closed to stop the supply of the altering agent into the process chamber 201. Then, a gaseous substance and the like remaining in the process chamber 201 are removed from the process chamber 201 according to the same processing procedure and process conditions as in the purging in step F (purging). The processing temperature at the time of purging in this step is preferably the same as the processing temperature at the time of supplying the altering agent.

As the altering agent, for example, an O- and H-containing gas, an O-containing gas, an O- and N-containing gas, an O- and C-containing gas, and the like can be used. The altering agent can be used not only with thermal excitation within a non-plasma atmosphere but also with plasma-exciting the altering agent. That is, the altering agent may be an altering agent excited to a plasma state.

As the O- and H-containing gas, for example, the same gas as the various O- and H-containing gases exemplified as the oxidizing agent in step A2 can be used. As the O-containing gas, for example, an $O_2$ gas, an $O_3$ gas, and the like can be used. As the O- and N-containing gas, for example, a nitric oxide (NO) gas, a nitrous oxide ($N_2O$) gas, a nitrogen dioxide ($NO_2$) gas, an $O_2$ gas+$NH_3$ gas, an $O_3$ gas)+$NH_3$ gas, and the like can be used. As the O- and C-containing gas, for example, a carbon dioxide ($CO_2$) gas, a carbon monoxide (CO) gas, and the like can be used. One or more of these gases can be used as the altering agent.

(Step D)

After performing step C, the altered film formed on the surface of the SiN film as the second base of the wafer 200 is removed by exposing the altered film to a removing agent. Here, an example of removing the altered film formed on the surface of the SiN film by dry etching will be described.

In this step, the removing agent is supplied to the wafer 200 after performing step C, that is, the wafer 200 having the altered film on the surface of the wafer 200. As a result, the altered film formed on the surface of the SiN film of the wafer 200 can be exposed to the removing agent.

Specifically, the valve 243e is opened to allow the removing agent to flow into the gas supply pipe 232e. The flow rate of the removing agent is adjusted by the MFC 241e, and the removing agent is supplied into the process chamber 201 via the gas supply pipe 232b and the nozzle 249b and is exhausted through the exhaust port 231a. In this operation, the removing agent is supplied to the wafer 200 from the side of the wafer 200 (removing agent supply). At this time, the valves 243f to 243h may be opened to allow an inert gas to be supplied into the process chamber 201 via the nozzles 249a to 249c, respectively.

By supplying the removing agent to the wafer 200 under the process conditions to be described later, it is possible to remove (etch) the altered film formed on the surface of the SiN film. That is, in this step, after the etching resistance is increased by the heat treatment in step B, the film after being altered to decrease the etching resistance by the action of the altering agent in step C can be effectively removed. Since the altered film is changed to a film that is easily removed by the removing agent, that is, a film that is highly reactive with the removing agent, this altered film can be effectively and selectively removed in this step.

Further, as described above, when the heat-treated film is, for example, the SiOC film containing C, the heat-treated SiOC film can be oxidized to be altered into the SiO film. In this case, in a state before performing this step, the SiO film, which is a film after the SiOC film is altered, and a SiO film formed by a thermal oxidation method or a chemical vapor deposition method may exist on the surface of the wafer 200. In this case, since the former SiO film is a SiOC film-based film formed at a low temperature such as 120 degrees C. or lower, the SiO film has low film density in the first place, has further low film density by an amount of C removed from the heat-treated SiOC film, and has many defects in the film. In contrast, since the latter SiO film is formed by the thermal oxidation method or the chemical vapor deposition method, the SiO film has higher film density and fewer defects in the film than the former SiO film. Therefore, in this step, even when two types of SiO films with different film qualities as described above exist on the surface of the wafer 200, it is possible to selectively remove the former SiO film (the SiO film formed by oxidizing the heat-treated SiOC film) without removing the latter SiO film (the SiO film formed by the thermal oxidation method or the chemical vapor deposition method).

Figure 4F:
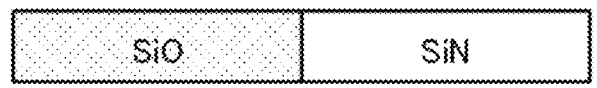

In this way, in this step, by removing (etching) the altered film formed on the surface of the SiN film as the second base of the wafer 200, the surface of the SiN film as the second base can be exposed as shown in FIG. 4F. At this time, for the above-mentioned reason, the altered film can be selectively removed without removing the SiN film as the second base and the SiO film as the first base.

The process conditions for supplying the removing agent in step D are exemplified as follows.

Processing temperature: room temperature (25 degrees C.) to 400 degrees C., specifically 50 to 200 degrees C.
Processing pressure: 1 to 13,332 Pa, specifically 100 to 1,333 Pa
Removing agent supply flow rate: 0.05 to 5 slm, specifically 0.1 to 2 slm
Removing agent supply time: 0.1 to 60 minutes, specifically 1 to 30 minutes
Inert gas supply flow rate (for each gas supply pipe): 1 to 10 slm, specifically 2 to 10 slm After removing the altered film from the surface of the wafer 200 to expose the surface of the SiN film, the valve 243e is closed to stop the supply of the removing agent into the process chamber 201. Then, the interior of the process chamber 201 is vacuum-exhausted to remove a gaseous substance and the like remaining in the process chamber 201 from the process chamber 201. Then, a gaseous substance and the like remaining in the process chamber 201 are removed from the process chamber 201 according to the same processing procedure and process conditions as in the purging in step F (purging). The processing temperature for purging in this step is preferably the same as the processing temperature for supplying the removing agent.

As the removing agent, for example, a F-containing gas can be used. As the F-containing gas, for example, a chlorine trifluoride ($ClF_3$) gas, a chlorine fluoride (ClF) gas, a nitrogen trifluoride ($NF_3$) gas, a hydrogen fluoride (HF) gas, a fluorine ($F_2$) gas, and the like can be used. One or more of these gases can be used as the F-containing gas.

As described above, in this step, the altered film is selectively removed. The film selectively removed in this step is preferably a film after oxidizing a C-containing film such as the heat-treated SiOC film. On the other hand, examples of films that are desired to remain on the surface of the wafer 200 without being removed in this step may include Si-containing films such as a Si film, a SiO film, a SiN film, a silicon oxycarbonitride film (SiOCN film), a silicon oxynitride film (SiON Film), a silicon carbonitride film (SiCN film), a silicon carbide film (SiC film), a silicon borocarbonitride film (SiBCN film), a silicon boronitride film (SiBN Film), and a silicon borocarbide film (SiBC film), metal-containing films such as a titanium nitride film (TiN film), a tungsten film (W film), a molybdenum film (Mo film), a ruthenium film (Ru film), a cobalt film (Co film), and a nickel film (Ni film), etc. These are preferably films formed by, for example, a thermal oxidation method, a thermal nitridation method, or a chemical vapor deposition method.

(After-Purging and Returning to Atmospheric Pressure)

After step D is completed, an inert gas acting as a purge gas is supplied into the process chamber 201 from each of the nozzles 249a to 249c and is exhausted through the exhaust port 231a. Thus, the interior of the process chamber 201 is purged and a gas, reaction by-products, and the like remaining in the process chamber 201 are removed from the process chamber 201 (after-purging). After that, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115, and the lower end of the manifold 209 is opened. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter close). The processed wafers 200 are unloaded from the reaction tube 203 and are then discharged from the boat 217 (wafer discharging).

(3) Effects of the Present Embodiments

According to the present embodiments, one or more effects set forth below may be achieved.

By heat-treating the film formed on the wafer 200 by exposing the wafer 200 to the film-forming agent under the first temperature in step A under the second temperature higher than the first temperature in step B, it is possible to harden the film to increase the processing resistance, that is, the etching resistance, of the film. However, after performing a predetermined process to the wafer 200, it may be difficult to remove the heat-treated film having the increased etching resistance. In such a case, by performing step C, the film is altered to reduce the etching resistance of the heat-treated film, so that the heat-treated film can be changed into a film that is easily removed by the removing agent, that is, a film that is highly reactive with the removing agent. As a result, in step D, it is possible to selectively remove the film obtained after the heat-treated film is altered.

As described above, the etching resistance of the film is increased by the heat treatment in step B, the film having the etching resistance increased by the heat treatment is altered to reduce the etching resistance of the film in step C, and the film altered to reduce the etching resistance of the film having the etching resistance increased by the heat treatment is removed in step D. In this way, by altering the film to reduce the etching resistance of the heat-treated film and then performing step D, it is possible to effectively and selectively remove the altered film.

Further, in step C, the altering agent may be supplied to the heat-treated film without plasma-exciting the altering agent. This makes it possible to reduce the etching resistance of the heat-treated film while suppressing plasma damage to the wafer 200, so that the heat-treated film is altered into a film that can be easily removed by the removing agent. Further, in step C, the altering agent may be plasma-excited and supplied to the heat-treated film. This makes it possible to reduce the etching resistance of the heat-treated film while utilizing the plasma energy, and enhance the effect of altering the heat-treated film into a film that can be easily removed by the removing agent.

Further, in step A, the cycle including (non-simultaneously performing) step A1 of supplying the precursor as the film-forming agent to the wafer 200 and step A2 of supplying the oxidizing agent as the film-forming agent to the wafer 200 is performed a predetermined number of times. This makes it possible to form a film on the wafer 200 with good controllability. Further, in at least one selected from the group of step A1 and step A2, it is preferable to further supply the catalyst to the wafer 200. This makes it possible to increase the reactivity of the reaction generated in at least one selected from the group of step A1 and step A2 to form a film at a lower temperature.

Further, when the film formed in step A is a film containing Si, C, and O such as a SiOC film, it is possible to more appropriately perform the heat treatment in step B, the alteration in step C, and the like. The film containing Si, C, and O is heat-treated in step B and then undergoes step C to be changed into a film that is easily removed by the removing agent, that is, a film that is highly reactive with the removing agent, which makes it possible to obtain the above-mentioned effects particularly remarkably.

(4) Modifications

The processing sequence in the present embodiments can be changed as in the following modifications. These modifications can be used in proper combination. Unless otherwise stated, the processing procedures and process conditions in each step of each modification can be the same as the processing procedures and process conditions in each step of the above-described processing sequence.

(Modification 1)

As in the processing sequence shown below, step F in the above-described embodiments may be omitted. For example, in a case that it may not be selectively form a film on a predetermined surface of the wafer 200 in step A, step F can be omitted. This modification also obtains the same effects as the above-described embodiments. Further, by omitting step F, it is possible to shorten the total processing time, thereby improving the productivity.

(Precursor+Catalyst→Oxidizing agent+Catalyst)×
n→Heat treatment→Predetermined process-
s→Altering agent→Removing agent (Modification 2)

As in the processing sequence shown below, in step A1, the precursor may be supplied alone as the film-forming agent without supplying the catalyst to the wafer 200. Further, in step A2, the oxidizing agent may be supplied alone as the film-forming agent without supplying the catalyst to the wafer 200. By supplying the precursor and the catalyst to the wafer 200, it is possible to promote the chemisorption of at least a portion of the molecular structure of the molecules constituting the precursor on the surface of the wafer at a low temperature. Further, by supplying the oxidizing agent and the catalyst to the wafer 200, it is possible to increase the oxidation rate at a low temperature. However, in a case where the oxidation rate and the chemisorption reaction of at least a portion of the molecular structure of the molecules constituting the precursor on the surface of the wafer are adjusted by selection of the type (characteristic) of the precursor and the process conditions such as the processing temperature and the processing pressure, the supply of the catalyst in steps A1 and A2 can be omitted. This modification also obtains the same effects as the above-described embodiments.

Modifying agent→(Precursor→Oxidizing agent+
Catalyst)×n→Heat treatment→Predetermined
process→Altering agent→Removing agent Modifying agent→(Precursor+Catalyst→Oxidizing
agent)×n→Heat treatment→Predetermined pro-
cess→Altering agent→Removing agent Modifying agent→(Precursor→Oxidizing agent)×
n→Heat treatment→Predetermined proces-
s→Altering agent→Removing agent (Modification 3)

As in the processing sequence shown below, step B may be performed (at the same time) when step E is performed, or may be performed after step E is performed. That is, step B may be performed before step E is performed as in the above-described embodiments, or may be performed when step E is performed or after step E is performed as in this modification. When step B is performed at the same time as step E, a predetermined process (etching, film formation, or treatment) is performed while heat-treating the wafer 200 at the second temperature higher than the first temperature. By performing step B at the same time as step E, it is possible to shorten the time for performing steps B and E. This modification also obtains the same effects as the above-described embodiments.

Modifying agent→(Precursor+Catalyst→Oxidizing
agent+Catalyst)×n→Heat treatment→Predeter-
mined process→Altering agent→Removing
agent Modifying agent→(Precursor+Catalyst→Oxidizing
agent+Catalyst)×n→Predetermined pro-
cess→Heat treatment→Altering agent→Remov-
ing agent Other Embodiments of the Present Disclosure The embodiments of the present disclosure have been specifically described above.

However, the present disclosure is not limited to the above-described embodiments, and various changes can be made without departing from the gist thereof.

For example, at least one selected from the group of step F, step A, step B, step E, step C, and step D may be performed in different processing parts, that is, in different process chambers (ex-situ). At this time, step F, step A, step B, step E, step C, and step D are performed by a substrate processing system provided with separate processing parts that perform one or more steps.

Another Embodiment 1

Figure 5:
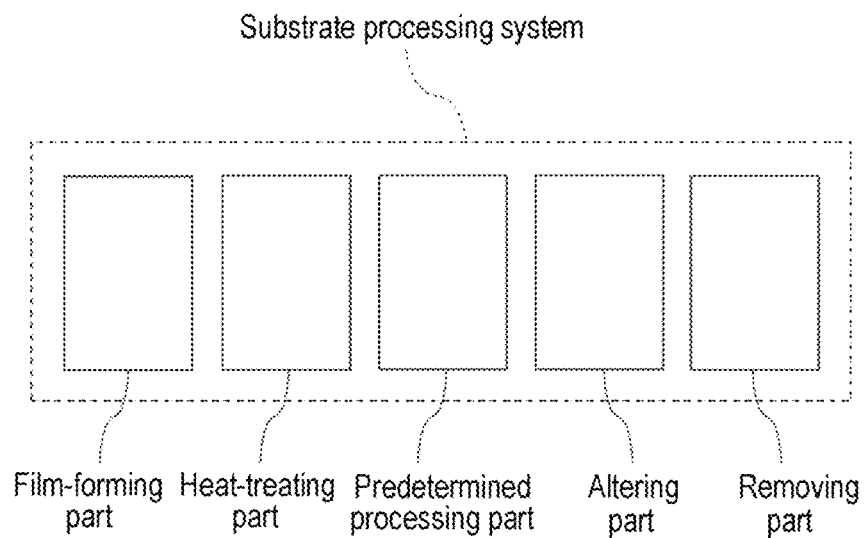
FIG. 5 is a block diagram for explaining an example of a substrate processing system suitably used in other embodiments of the present disclosure.

As shown in FIG. 5, an example in which steps F and A, step B, step E, step C, and step D are performed in separate process chambers (ex-situ) is shown in another embodiment 1. Another embodiment 1 is also an example in which steps F and A are performed in the same process chamber (in-situ). Another embodiment 1 can be performed in a substrate processing system provided with five processing parts (five stand-alone type apparatuses) of a film-forming part, a heat-treating part, a predetermined processing part, an altering part, and a removing part, as shown in FIG. 5. In FIG. 5, step F and step A are performed in the film-forming part, step B is performed in the heat-treating part, step E is performed in the predetermined processing part, step C is performed in the altering part, and step D is performed in the removing part.

Another Embodiment 2

Figure 6:
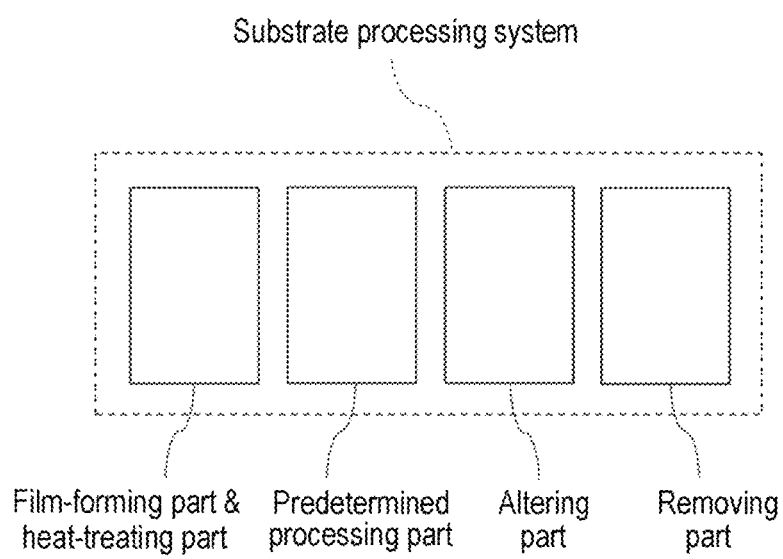
FIG. 6 is a block diagram for explaining another example of the substrate processing system suitably used in other embodiments of the present disclosure.

As shown in FIG. 6, an example in which step F, steps A and B, step E, step C, and step D are performed in separate process chambers (ex-situ) is shown in another embodiment 2. Another embodiment 2 is also an example in which step F and steps B and A are performed in the same process chamber (in-situ). Another embodiment 2 can be performed in a substrate processing system provided with four processing parts (four stand-alone type apparatuses) of a film-forming part & heat-treating part, a predetermined processing part, an altering part, and a removing part, as shown in FIG. 6. In FIG. 6, step F and steps A and B are performed in the film-forming part & heat-treating part, step E is performed in the predetermined processing part, step C is performed in the altering part, and step D is performed in the removing part. Heat treatment can be performed at a timing when a film formed on the wafer 200 under the first temperature (after the film formation) is heated under the second temperature higher than the first temperature.

Another Embodiment 3

Figure 7:
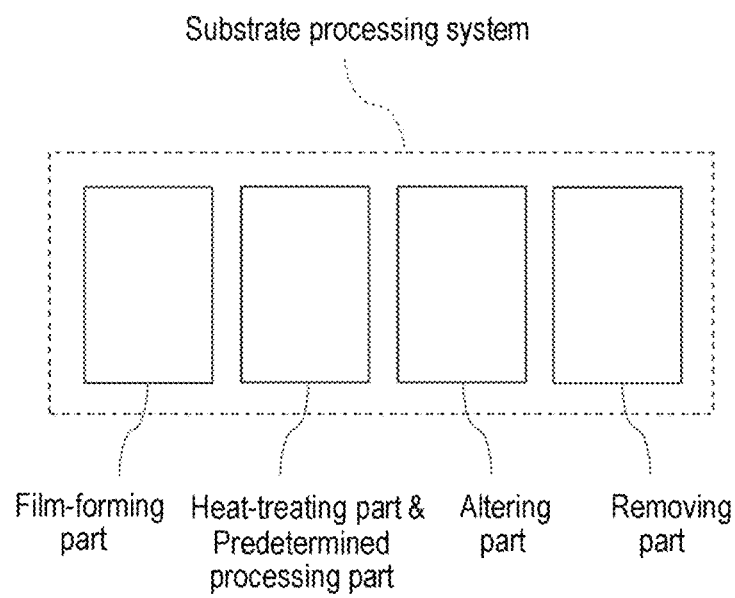
FIG. 7 is a block diagram for explaining yet another example of the substrate processing system suitably used in other embodiments of the present disclosure.

As shown in FIG. 7, an example in which steps F and A, steps B and E, step C, and step D are performed in separate process chambers (ex-situ) is shown in another embodiment 3. Another embodiment 3 is also an example in which steps F and A and steps B and E are performed in the same process chamber (in-situ). Another embodiment 3 can be performed in a substrate processing system provided with four processing parts (four stand-alone type apparatuses) of a film-forming part, a heat-treating part & predetermined processing part, an altering part, and a removing part, as shown in FIG. 7. In FIG. 7, steps F and A are performed in the film-forming part, steps B and E are performed in the heat-treating part & predetermined processing part, step C is performed in the altering part, and step D is performed in the removing part. Heat treatment can be performed at a timing when a film formed on the wafer 200 is heated under the second temperature higher than the first temperature before performing the predetermined process, when performing the predetermined process (simultaneously), or after performing the predetermined process.

When at least one selected from the group of step F, step A, step B, step E, step C, and step D is performed in the same process chamber (in-situ) as in the another embodiments 1 to 3 described above, in the middle of each step, the chance of the wafer 200 being exposed to the atmosphere is reduced and the wafer 200 can be processed while being placed under vacuum, so that stable substrate processing can be performed. Further, when at least one selected from the group of step F, step A, step B, step E, step C, and step D is performed in separate process chambers (ex-situ), the temperature in each process chamber can be set to, for example, the processing temperature at each step or a temperature close to the processing temperature in advance, so that the time for temperature adjustment can be shortened, thereby improving the production efficiency.

Yet Another Embodiment

In the above embodiment, the example of using dry etching in step D has been described, but in step D, wet etching may be used. That is, in step D, the altered film formed on the surface of the wafer 200 may be removed (etched) by the wet etching. In the wet etching, for example, an aqueous solution (DHF) containing HF or a thermal phosphoric acid aqueous solution can be used as the removing agent. In particular, when the heat-treated film is a SiOC film containing C and the heat-treated SiOC film is oxidized to be altered into a SiO film, it is preferable that the wet etching is performed by using DHF as the removing agent. This makes it possible to effectively and selectively remove the altered film.

In this embodiment, by exposing the wafer 200 to DHF or the thermal phosphoric acid aqueous solution, the altered film formed on the surface of the wafer 200 can be removed (etched). An example of a method of exposing the wafer 200 to DHF or the thermal phosphoric acid aqueous solution may include a method of immersing the wafer 200 in DHF or the thermal phosphoric acid aqueous solution. In addition, in order to more effectively remove the altered film formed on the surface of the wafer 200, both dry etching and wet etching may be performed in step D. This embodiment also obtains the same effects as the above-described embodiment.

Further, in the above embodiment, the example in which the Si-, C-, and halogen-containing gas and the O- and H-containing gas are used in step A has been described, but the present disclosure is not limited to this example. For example, in step A, a film may be formed on the wafer 200 by using an alkylenesilane compound such as 1,4-disilanebutane ($SiH_3CH_2CH_2SiH_3$, abbreviation: 1,4-DSB) and an oxidizing agent such as an $O_2$ gas. Further, a film may be formed on the wafer 200 by using alkylalkoxysilane such as diethoxymethylsilane and an oxidizing agent such as an $O_2$ gas. That is, a compound containing Si and at least one selected from the group of an alkylene group, an alkyl group, and an alkoxy group may be used as the precursor, and an O-containing gas may be used as the oxidizing agent. In these cases, the precursor and the oxidizing agent may be supplied at the same time to form a film by using a CVD method, even in which case the same reaction as described above can be generated in each step. This embodiment also obtains the same effects as the above-described embodiment.

The wafer 200 may have a plurality of types of regions having different materials as the first base, or may have a plurality of types of regions having different materials as the second base. The regions constituting the first base and the second base may include, in addition to the above-mentioned SiO film and SiN film, films containing semiconductor elements, such as a SiOCN film, a SiON film, a SiOC film, a SiC film, a SiCN film, a SiBN film, a SiBCN film, a SiBC film, a Si film, a germanium film (Ge film), and a silicon germanium film (SiGe film), films containing metal elements, such as a TiN film, a W film, a Mo film, a Ru film, a Co film, and a Ni film, an amorphous carbon film (a-C film), a single crystal Si (Si wafer), etc. Any region can be used as the first base as long as it is a region where a film-forming inhibition layer can be formed. On the other hand, any region can be used as the second base as long as it is a region where a film-forming inhibition layer is difficult to be formed. This embodiment also obtains the same effects as the above-described embodiment.

Recipes used in each process may be prepared individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time has been described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, an example in which a film is formed by using a substrate processing apparatus provided with a hot-wall-type process furnace has been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process conditions as those in the above-described embodiments, and the same effects as the above-described embodiments are achieved.

The above-described embodiments may be used in proper combination. The processing procedures and process conditions used in this case may be the same as, for example, the processing procedures and process conditions in the above-described embodiments.

EXAMPLES

Example 1

Of the above-described processing sequences, steps A, B, and C were performed to a wafer to prepare an evaluation sample of Example 1. Specifically, a SiOC film was formed as a film on the surface of the wafer, the formed SiOC film was heat-treated, and the heat-treated SiOC film was altered (oxidized) to prepare the evaluation sample of Example 1. The alteration (oxidation) of the heat-treated SiOC film was performed by a process using a plasma-excited $O_2$ gas under a first condition. The evaluation sample of Example 1 has a film altered (oxidized) by the process using the plasma-excited $O_2$ gas under the first condition on the surface of the wafer. The process conditions in each step when preparing the evaluation sample of Example 1 were set to predetermined conditions within the range of the process conditions in each of the above-described steps.

Example 2

Step A, step B, and step C were performed to a wafer to prepare an evaluation sample of Example 2 in the same manner as in the preparation of the evaluation sample of Example 1 except that the alteration (oxidation) of the heat-treated SiOC film was replaced with a process using a $H_2$ gas+$O_2$ gas. The evaluation sample of Example 2 has a film altered (oxidized) by the process using the $H_2$ gas+$O_2$ gas on the surface of the wafer. The process conditions in step C when preparing the evaluation sample of Example 2 were set to predetermined conditions within the range of the process conditions in the above-described step C. Further, the process conditions in steps A and B when preparing the evaluation sample of Example 2 were set to the same as the process conditions in steps A and B when preparing the evaluation sample of Example 1, respectively.

Example 3

Step A, step B, and step C were performed to a wafer to prepare an evaluation sample of Example 3 in the same manner as in the preparation of the evaluation sample of Example 1 except that the alteration (oxidation) of the heat-treated SiOC film was replaced with a process using a plasma-excited $O_2$ gas under a second condition. The evaluation sample of Example 3 has a film altered (oxidized) by the process using the plasma-excited $O_2$ gas under the second condition on the surface of the wafer. The second condition is a condition in which the oxidizing power is weaker than that of the first condition. The process conditions in step C when preparing the evaluation sample of Example 3 were set to predetermined conditions within the range of the process conditions in the above-described step C. Further, the process conditions in steps A and B when preparing the evaluation sample of Example 3 were set to the same as the process conditions in steps A and B when preparing the evaluation sample of Example 1, respectively.

Comparative Example 1

Thermal oxidation treatment was performed to a wafer under an O-containing atmosphere of 800 degrees C. or higher to form a SiO film as a thermal oxide film on the surface of the wafer and prepare an evaluation sample of Comparative Example 1. The evaluation sample of Comparative Example 1 has the SiO film, which is the thermal oxide film, on the surface of the wafer.

Comparative Example 2

An evaluation sample of Comparative Example 2 was prepared in the same manner as the preparation of the evaluation sample of Example 1 except that step A and step B were performed and step C was omitted. The evaluation sample of Comparative Example 2 has a heat-treated SiOC film formed in steps A and B on the surface of a wafer. The process conditions in steps A and B when preparing the evaluation sample of Comparative Example 2 were the same as the process conditions in steps A and B when preparing the evaluation sample of Example 1, respectively.

[Measurement of Wet Etching Rate (WER)]

Figure 8:
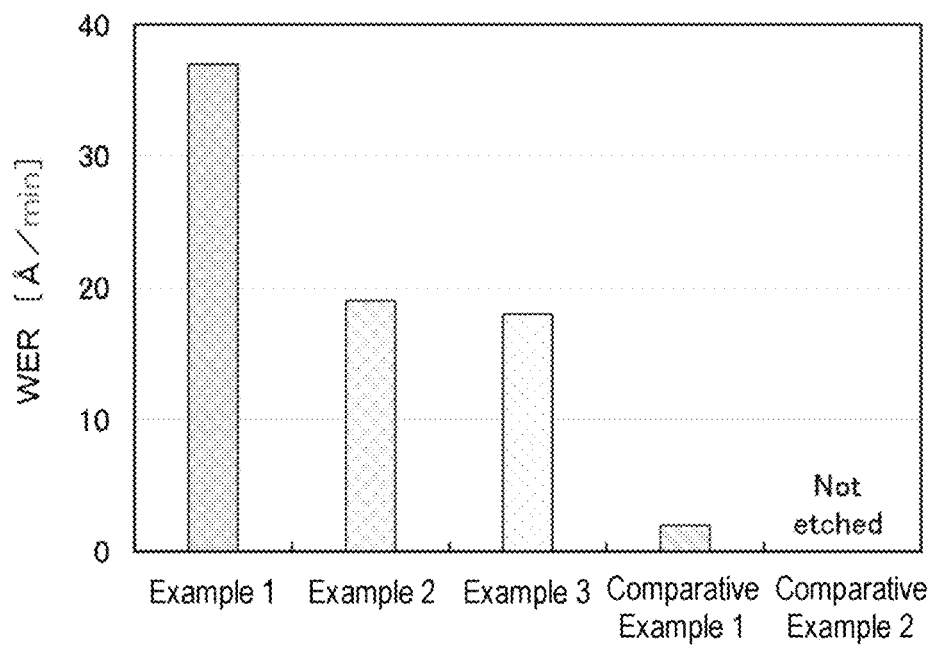
FIG. 8 is a graph showing evaluation results in Examples and Comparative Examples.

Wet etching with DHF corresponding to step D was performed to each of the evaluation samples and WER of a film of each of the evaluation samples was measured. As DHF, a 0.1% concentration HF aqueous solution was used. The measurement results are shown in FIG. 8. In FIG. 8, the horizontal axis represents Example 1, Example 2, Example 3, Comparative Example 1, and Comparative Example 2 sequentially from the left side, and the vertical axis represents WER[/min].

It can be seen from FIG. 8 that the WER of the film in the evaluation sample of Comparative Example 1 is about several Å/min and the WER of the film in the evaluation sample of Comparative Example 2 is 0 Å/min, which means that etching could not be performed. In contrast, it can be seen from FIG. 8 that all the WERs of the films in the evaluation samples of Examples 1 to 3 exceed 18 Å/min, which are higher than the WERs of the films in the evaluation samples of Comparative Examples 1 and 2.

Further, it can be seen from FIG. 8 that the SiOC film formed on the surface of the wafer in step A has increased etching resistance by undergoing the heat treatment in step B (see Comparative Example 2), but is altered (oxidized) in the subsequent step C, thereby being easily removed in step D (see Examples 1 to 3). Further, it can be seen that the thermal oxide film has high etching resistance, and thus it is difficult to be removed (see Comparative Example 1). Therefore, for example, when the thermal oxide film and the SiOC film formed in step A exist on the surface of the wafer, it can be seen that, by going through step B, step C, and step D, it is possible to selectively etch a film obtained after the SiOC film is heat-treated and then altered, while suppressing the etching of the thermal oxide film.

According to the present disclosure in some embodiments, it is possible to selectively remove a film after heat treatment.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a film on the substrate by exposing the substrate to a film-forming agent under a first temperature;
   (b) heat-treating the film under a second temperature higher than the first temperature;
   (c) altering the heat-treated film by exposing the heat-treated film to an altering agent; and
   (d) removing the altered film by exposing the altered film to a removing agent,
   wherein the film formed on the substrate in (a) contains carbon, and
   wherein in (c), the heat-treated film is oxidized to remove carbon in the film or reduce a carbon concentration in the film.

2. The method according to claim 1, wherein in (b), an etching resistance of the film is increased by the heat treatment,
   wherein in (c), the film is altered to reduce the etching resistance of the film after the etching resistance is increased by the heat treatment, and
   wherein in (d), the film, which has been altered to reduce the etching resistance after the etching resistance has been increased by the heat treatment, is removed.

3. The method according to claim 1, wherein (c) includes supplying the altering agent to the heat-treated film without plasma-exciting the altering agent.

4. The method according to claim 1, wherein (c) includes supplying the altering agent to the heat-treated film with plasma-exciting the altering agent.

5. The method according to claim 1, wherein in (c), an oxidizing agent is used as the altering agent.

6. The method according to claim 1, wherein the first temperature is 100 degrees C. or lower, and the second temperature is 300 degrees C. or higher.

7. The method according to claim 1, wherein in (a), a cycle, which include s performing (a1) supplying a precursor as the film-forming agent to the substrate and (a2) supplying an oxidizing agent as the film-forming agent to the substrate, is performed a predetermined number of times.

8. The method according to claim 7, wherein in at least one selected from the group of (a1) and (a2), a catalyst is further supplied to the substrate.

9. The method according to claim 1, wherein the film is a film containing silicon, carbon, and oxygen.

10. The method according to claim 1, further comprising: (e) performing a predetermined process to the substrate after performing (a) and before performing (c),
    wherein the predetermined process includes at least one selected from the group of etching, film formation, and treatment.

11. The method according to claim 1, wherein in a state before performing (c), a plurality of types of films including the heat-treated film exists on a surface of the substrate,
    wherein in (c), among the plurality of types of films, the heat-treated film is selectively altered, and
    wherein in (d), among the plurality of types of films, the altered film is selectively removed.

12. The method according to claim 1, wherein in a state before performing (a), a surface of the substrate includes a first base and a second base,
    wherein the method further comprises: (f) forming a film-forming inhibition layer on a surface of the first base by supplying a modifying agent to the substrate, before performing (a), and
    wherein in (a), the film is formed on a surface of the second base.

13. The method according to claim 12, wherein in (b), an etching resistance of the film is increased by the heat treatment.

14. The method according to claim 12, wherein an etching process is performed to the substrate after performing (a) and before performing (c).

15. The method according to claim 12, wherein a film-forming process is performed to the substrate after performing (a) and before performing (c).

16. The method according to claim 12, wherein at least one selected from the group of plasma treatment and thermal treatment is performed to the substrate after performing (a) and before performing (c).

17. The method according to claim 1, wherein in (d), the altered film is re moved by at least one selected from the group of dry etching and wet etching.

18. A method of manufacturing a semiconductor device, comprising:
    (a) forming a film on a substrate by exposing the substrate to a film-forming agent under a first temperature;
    (b) heat-treating the film under a second temperature higher than the first temperature;
    (c) altering the heat-treated film by exposing the heat-treated film to an altering agent; and
    (d) removing the altered film by exposing the altered film to a removing agent,
    wherein the film formed on the substrate in (a) contains carbon, and
    wherein in (c), the heat-treated film is oxidized to remove carbon in the film or reduce a carbon concentration in the film.

19. A non-transitory computer-readable recording medium storing a program that causes, by a computer, a substrate processing system to perform a process comprising:
    (a) forming a film on a substrate by exposing the substrate to a film-forming agent under a first temperature;
    (b) heat-treating the film under a second temperature higher than the first temperature;
    (c) altering the heat-treated film by exposing the heat-treated film to an altering agent; and
    (d) removing the altered film by exposing the altered film to a removing agent,
    wherein the film formed on the substrate in (a) contains carbon, and
    wherein in (c), the heat-treated film is oxidized to remove carbon in the film or reduce a carbon concentration in the film.

* * * * *